(12) United States Patent
Yasui

(10) Patent No.: US 11,942,305 B2
(45) Date of Patent: Mar. 26, 2024

(54) DATA GENERATION METHOD, CHARGED PARTICLE BEAM IRRADIATION DEVICE, AND COMPUTER-READABLE RECORDING MEDIUM

(71) Applicant: NuFlare Technology, Inc., Yokohama (JP)

(72) Inventor: Kenichi Yasui, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/844,360

(22) Filed: Jun. 20, 2022

(65) Prior Publication Data
US 2023/0053272 A1 Feb. 16, 2023

(30) Foreign Application Priority Data
Aug. 10, 2021 (JP) .................. 2021-130792

(51) Int. Cl.
*H01J 37/302* (2006.01)
*H01J 37/317* (2006.01)

(52) U.S. Cl.
CPC ........ *H01J 37/302* (2013.01); *H01J 37/3177* (2013.01); *H01J 2237/22* (2013.01)

(58) Field of Classification Search
CPC ... H01J 37/302; H01J 37/3177; H01J 2237/22
See application file for complete search history.

(56) References Cited

U.S. PATENT DOCUMENTS

2006/0023933 A1  2/2006 Mitsui
2007/0211061 A1*  9/2007 Kokojima ............... G09G 5/246
                                                   345/441
(Continued)

FOREIGN PATENT DOCUMENTS

CN  101764945 A  6/2010
JP  08-149262 A  6/1996
(Continued)

OTHER PUBLICATIONS

Taiwanese Office Action and Search Report dated Dec. 12, 2022 in Patent Application No. 111122221 with Unedited Computer Generated English Translation, 9 pages

*Primary Examiner* — Sean M Luck
(74) *Attorney, Agent, or Firm* — Oblon, McClelland, Maier & Neustadt, L.L.P.

(57) ABSTRACT

In one embodiment, a data generation method includes generating a plurality of parametric elements by dividing, at positions of an extremum and an inflection point, a parametric curve that expresses a shape of a writing pattern and is defined by a plurality of control points arranged in order in a predetermined direction, generating a polygon by extracting, for each of the parametric elements, one or some of the plurality of control points and connecting the extracted control points in order in the predetermined direction, calculating a coverage by the polygon in each of a plurality of rectangular segmented regions obtained by dividing a target to be irradiated with a charged particle beam into a predetermined size, and calculating a coverage of each segmented region in a peripheral part of the writing pattern by finding intersections of each of the plurality of parametric elements and four sides of each of the plurality of segmented regions.

12 Claims, 8 Drawing Sheets

(56) References Cited

U.S. PATENT DOCUMENTS

| | | |
|---|---|---|
| 2011/0199381 A1 | 8/2011 | Tamai |
| 2020/0051782 A1 | 2/2020 | Sakamoto et al. |
| 2020/0278612 A1 | 9/2020 | Yasui et al. |

FOREIGN PATENT DOCUMENTS

| | | |
|---|---|---|
| JP | 2006-038815 A | 2/2006 |
| JP | 2008-009897 A | 1/2008 |
| JP | 2010-113624 A | 5/2010 |
| JP | 2018-121139 A | 8/2018 |
| JP | 2019-057562 A | 4/2019 |
| TW | 202006793 A | 2/2020 |

* cited by examiner

FIG.6a
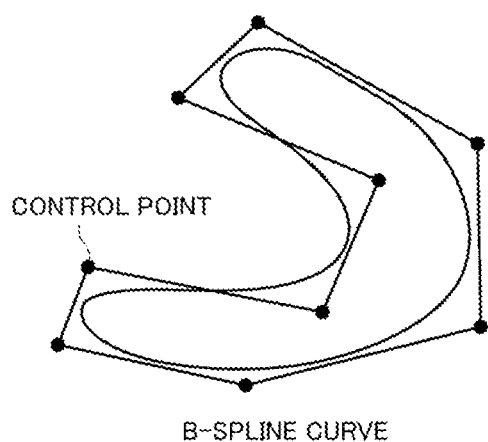
B-SPLINE CURVE
FIG.6b
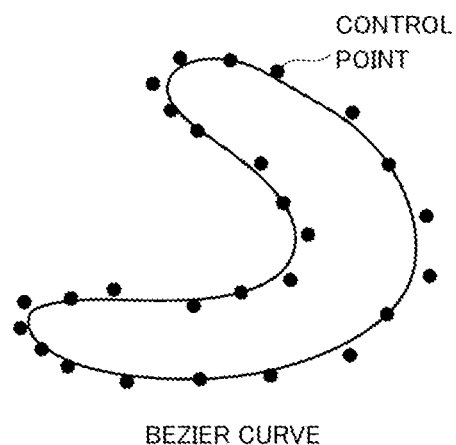
BEZIER CURVE
FIG.6c
CONVERSION FORMULA
$$P_b = \frac{1}{6}\begin{Bmatrix} 1 & 4 & 1 & 0 \\ 0 & 4 & 2 & 0 \\ 0 & 2 & 4 & 0 \\ 0 & 1 & 4 & 1 \end{Bmatrix} P_s$$
$P_s$ : CONTROL POINT OF SPLINE CURVE
$P_b$ : CONTROL POINT OF BEZIER CURVE
FIG.7a
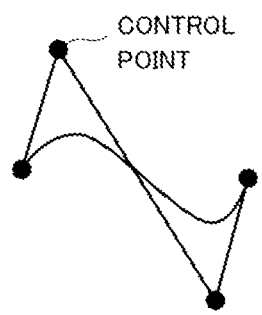
FIG.7b
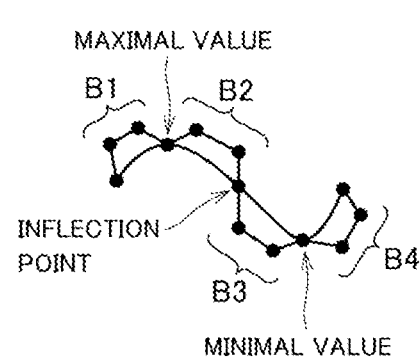
FIG.7c
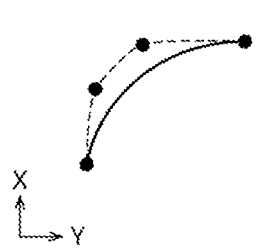

FIG.9a

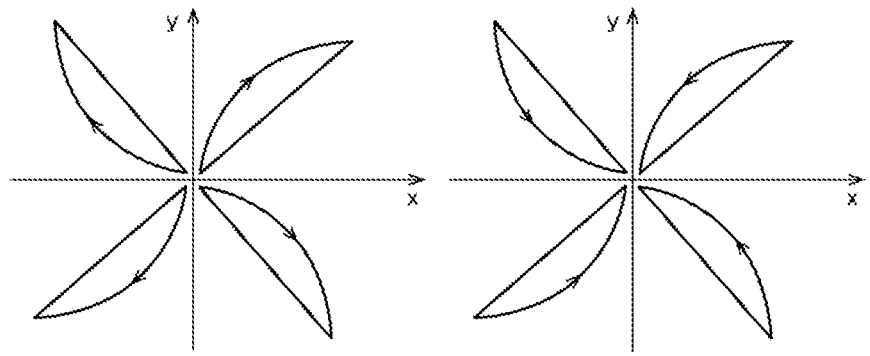

FIG.9b    BASIC BEZIER ELEMENT

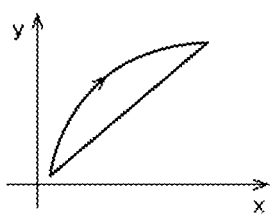

BEZIER CURVE
$$P(t) = (1-t)^3 P_0 + 3 \cdot t(1-t)^2 P_1 + 3 \cdot t^2(1-t) P_2 + t^3 P_3$$
$$x(t) = (x_3 - 3x_2 + 3x_1 - x_0)t^3 + (3x_2 - 6x_1 + 3x_0)t^2 + (3x_1 - 3x_0)t + x_0$$
$$= Bax t^3 + Bb_x t^2 + Bc x t + Bdx$$
$$y(t) = Bay t^3 + Bby t^2 + Bcy t + Bdy$$

STRAIGHT LINE
REPRESENTING ⇒ $Ax + By + C = 0$
PIXEL BOUND $A = y2 - y1$
$B = x1 - x2$
$C = x1(y1 - y2) + y1(x2 - x1)$

EQUATION FOR
FINDING ⇒ $at^3 + bt^2 + ct + d = 0$
INTERSECTION $a = ABax + BBa^y$
$b = AB_b^x + BBb^y$
$c = ABc^x + BBc^y$
$d = ABd^x + BBd^y + C$

DATA GENERATION METHOD, CHARGED PARTICLE BEAM IRRADIATION DEVICE, AND COMPUTER-READABLE RECORDING MEDIUM

CROSS REFERENCE TO RELATED APPLICATION

This application is based upon and claims benefit of priority from the Japanese Patent Application No. 2021-130792, filed on Aug. 10, 2021, the entire contents of which are incorporated herein by reference.

FIELD

The present invention relates to a data generation method, a charged particle beam irradiation device, and a computer-readable recording medium.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. The highly precise original image pattern is written by using an electron beam writing apparatus, in which a technology commonly known as electron beam lithography is used.

A known example of the electron beam writing device is a multi-beam writing device that achieves an improved throughput by radiating a lot of beams at one time by using multi-beams. In this multi-beam writing device, for example, an electron beam emitted from an electron gun passes an aperture member having a plurality of openings. This forms multi-beams, and blanking of each beam is controlled by a blanking plate. A beam that is not blocked is reduced by an optical system and reaches a desired position on a mask on which a pattern is to be written.

In electron beam writing using a multi-beam writing device, an irradiation amount of each beam is controlled by calculating a coverage of an input figure for each of pixels that are sections of a predetermined size obtained by division. In a case where the input figure includes a curve, a coverage can be calculated relatively easily by approximation to a polygon. However, high-precision approximation increases the number of vertexes of an approximate polygon, thereby undesirably taking a long time for data processing.

BRIEF DESCRIPTION OF THE DRAWINGS

FIG. 6a illustrates an example of a B-spline curve, FIG. 6b illustrates an example of a Bezier curve, and FIG. 6c illustrates a conversion formula.

FIG. 7a illustrates an example of a Bezier curve, FIG. 7b illustrates an example of division of the Bezier curve, and FIG. 7c illustrates an example of a Bezier element.

FIG. 9a illustrates an example of classification of Bezier elements, and FIG. 9b illustrates an example of a Bezier basic element.

FIG. 10 is a formula for explaining an intersection calculation method.

DETAILED DESCRIPTION

In one embodiment, a data generation method includes generating a plurality of parametric elements by dividing, at positions of an extremum and an inflection point, a parametric curve that expresses a shape of a writing pattern and is defined by a plurality of control points arranged in order in a predetermined direction, generating a polygon by extracting, for each of the parametric elements, one or some of the plurality of control points and connecting the extracted control points in order in the predetermined direction, calculating a coverage by the polygon in each of a plurality of rectangular segmented regions obtained by dividing a target to be irradiated with a charged particle beam into a predetermined size, and calculating a coverage of each segmented region in a peripheral part of the writing pattern by finding intersections of each of the plurality of parametric elements and four sides of each of the plurality of segmented regions.

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
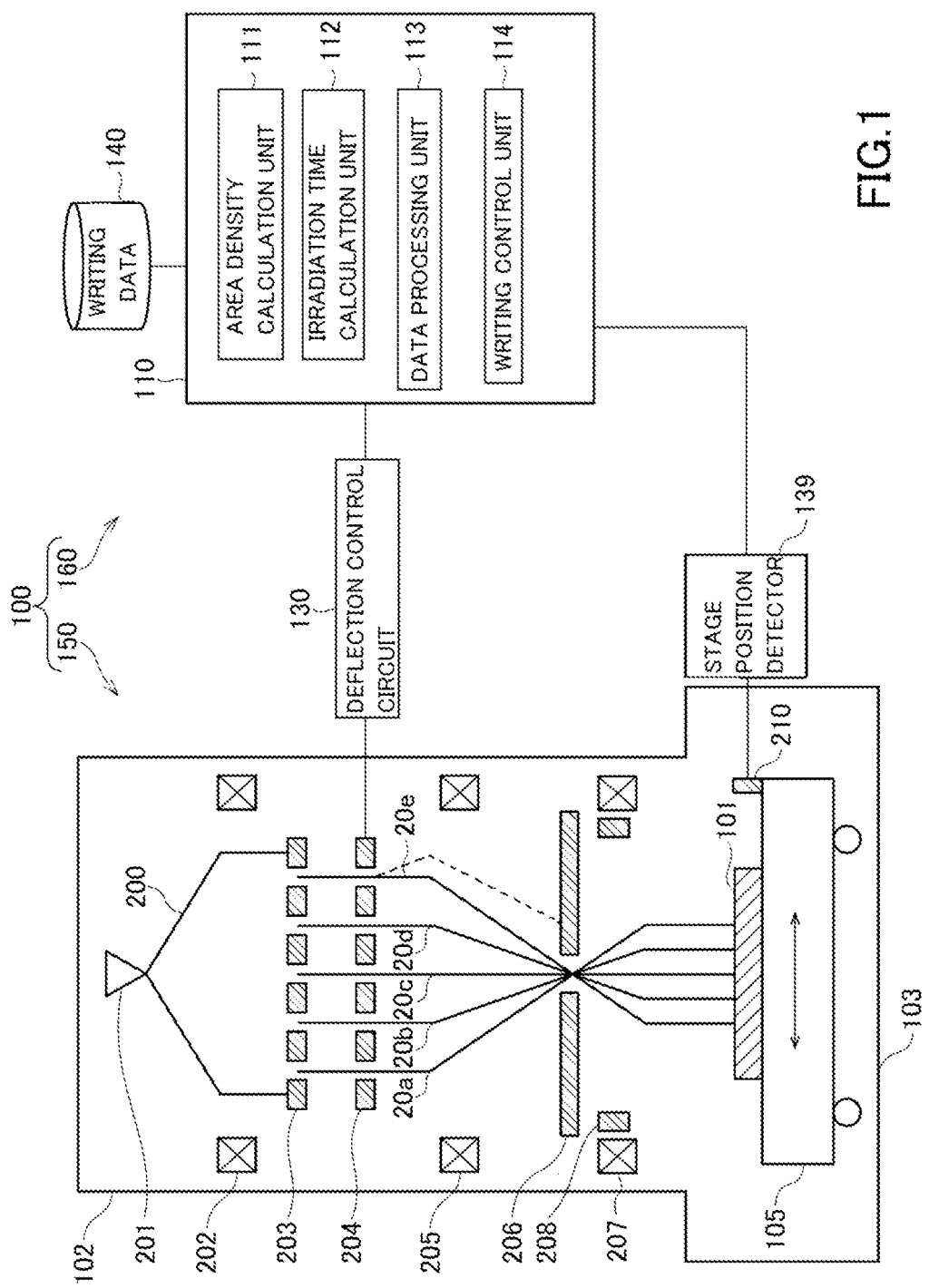
FIG. 1 is a schematic view of a multi charged particle beam writing device according to an embodiment of the present invention.

FIG. 1 illustrates an outline configuration of a writing device according to an embodiment. As illustrated in FIG. 1, the writing device 100 includes a writing unit 150 and a control unit 160. The writing device 100 is an example of a multi charged particle beam writing device. The writing unit 150 includes an electron column 102 and a writing chamber 103. In the electron column 102, an electron gun 201, a lighting lens 202, a shaping aperture array plate 203, a blanking aperture array plate 204, a reducing lens 205, a limiting aperture member 206, an objective lens 207, and a deflector 208 are disposed.

In the writing chamber 103, an XY stage 105 is disposed. A substrate 101 on which a pattern is to be written is disposed on the XY stage 105. The substrate 101 is, for example, mask blanks or a semiconductor substrate (silicon wafer). Furthermore, a mirror 210 for position measurement is disposed on the XY stage 105.

The control unit 160 has a control calculator 110, a deflection control circuit 130, a stage position detector 139, and a storage unit 140. The storage unit 140 stores therein writing data supplied from an outside. In the writing data, information on a plurality of figure patterns describing patterns to be formed on the substrate 101 is defined. The figure patterns include a curve, and a shape thereof is defined, for example, by a cubic B-spline curve, as described later.

The control calculator 110 has an area density calculation unit 111, an irradiation time calculation unit 112, a data processing unit 113, and a writing control unit 114. Each unit of the control calculator 110 may be realized by hardware such as an electric circuit or may be realized by software such as programs that execute these functions. Alternatively, each unit of the control calculator 110 may be realized by a combination of hardware and software.

The stage position detector 139 irradiates the mirror 210 with a laser, receives reflected light, and detects a position of the XY stage 105 by using the principle of laser interferometry.

Figure 2:
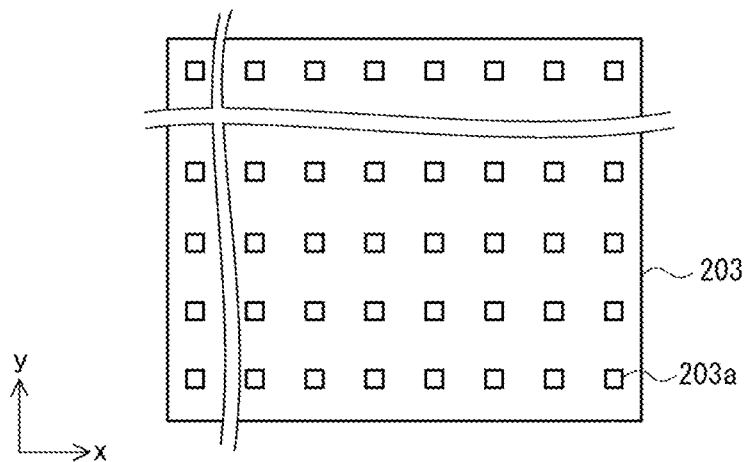
FIG. 2 is a plan view of a shaping aperture array plate.

FIG. 2 is a conceptual diagram illustrating a configuration of the shaping aperture array plate 203. As illustrated in FIG. 2, the shaping aperture array plate 203 has a plurality of openings 203a formed at predetermined intervals along a lengthwise direction (y direction) and a lateral direction (x direction). The openings 203a are preferably rectangles or circles having the same dimension and shape. A part of an electron beam 200 passes each of the plurality of openings 203a, and thus multi-beams 20a to 20e are formed.

The blanking aperture array plate 204 has passage holes at positions corresponding to the openings 203a of the shaping aperture array plate 203. A blanker made up of a pair of electrodes is disposed in each passage hole. Of the two electrodes of the blanker, for example, one electrode is grounded and kept at a ground potential, and the other electrode is switched to a ground potential or a potential other than the ground potential. This switches OFF/ON of deflection of a beam passing a passage hole, thereby controlling blanking. In a case where the blanker does not deflect a beam, the beam is ON. In a case where the blanker deflects a beam, the beam is OFF. In this way, the plurality of blankers perform blanking deflection of corresponding beams of multi-beams that have passed the plurality of openings 203a of the shaping aperture array plate 203.

The electron beam 200 emitted from the electron gun 201 (emitting unit) illuminates the whole shaping aperture array plate 203 due to the lighting lens 202. The electron beam 200 illuminates a region including all of the openings 203a. The electron beam 200 passes the plurality of openings 203a of the shaping aperture array plate 203, and thus a plurality of electron beams (multi beams) 20a to 20e having, for example, a rectangular shape is formed.

The multi-beams 20a to 20e pass corresponding blankers of the blanking aperture array plate 204. Each of the blankers performs blanking deflection of a beam that is switched off among electron beams that individually pass the blankers. Each of the blankers does not perform blanking deflection of a beam that is switched on. The multi-beams 20a to 20e that have passed the blanking aperture array plate 204 are reduced by the reducing lens 205 and travel toward a central opening of the limiting aperture member 206.

A beam that is controlled to a beam off state is deflected by the blanker and travels along a path passing an outside of the opening of the limiting aperture member 206 and is therefore blocked by the limiting aperture member 206. Meanwhile, a beam that is controlled to a beam on state is not deflected by the blanker and therefore passes the opening of the limiting aperture member 206. In this way, blanking control is performed by ON/OFF of deflection of the blanker, and thus ON/OFF of a beam is controlled. The blanking aperture array plate 204 functions as an irradiation time control unit that controls an irradiation time of each beam of multi-beams.

The limiting aperture member 206 allows beams deflected to a beam ON state by the blankers of the blanking aperture array plate 204 to pass therethrough and blocks beams deflected to a beam OFF state by the blankers of the blanking aperture array plate 204. One shot of multi-beams is formed by beams formed from beam ON to beam OFF and having passed the limiting aperture member 206.

The multi-beams that have passed the limiting aperture member 206 are focused by the objective lens 207 and form a pattern image of a desired reduction rate on the substrate 101. The beams (whole multi-beams) that have passed the limiting aperture member 206 are collectively deflected by the deflector 208 in the same direction and reach a desired position on the substrate 101.

In a case where the XY stage 105 is continuously moving, a beam irradiation position is controlled by the deflector 208 so as to follow movement of the XY stage 105 at least while the substrate 101 is irradiated with the beams. The multi-beams that are radiated one time are ideally arranged at intervals obtained by multiplying the intervals at which the plurality of openings 203a of the shaping aperture array plate 203 are arranged by the desired reduction rate.

Figure 3:
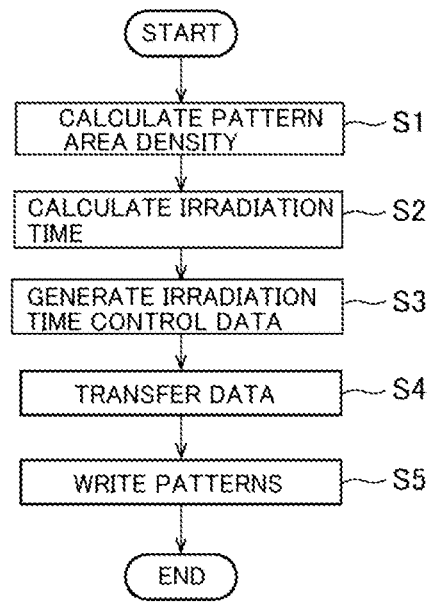
FIG. 3 is a flowchart for explaining a writing method.

Next, a pattern writing method according to the present embodiment is described with reference to the flowchart illustrated in FIG. 3. In a pattern area density calculation step (step S1), the area density calculation unit 111 virtually divides a writing region of the substrate 101 to be irradiated with a beam into a plurality of mesh regions. A size of each of the mesh regions is, for example, equivalent to a size of a single beam, and each of the mesh regions becomes a pixel (unit irradiation region). The area density calculation unit 111 reads out writing data from the storage unit 140, calculates a pattern area density (coverage) $\rho$ of each pixel (rectangular segmented region) by using a pattern defined in the writing data, and generates a pixel map that defines a coverage of each pixel. A method for generating the pixel map will be described later.

In an irradiation time calculation step (step S2), the irradiation time calculation unit 112 calculates an irradiation amount $\rho D0$ of a beam with which each pixel is irradiated by multiplying the pattern area density $\rho$ with a reference irradiation amount $D0$. The irradiation time calculation unit 112 may further multiply a correction coefficient for correcting a proximity effect or the like. The irradiation time calculation unit 112 calculates an irradiation time of each of the plurality of beams that constitute the multi-beams by dividing the irradiation amount by a current amount of the beam.

In an irradiation time control data generation step (step S3), the data processing unit 113 generates irradiation time control data by rearranging the irradiation time data in a shot order according to a writing sequence.

In a data transfer step (step S4), the writing control unit 114 supplies the irradiation time control data to the deflection control circuit 130. The deflection control circuit 130 supplies the irradiation time control data to each blanker of the blanking aperture array plate 204.

In a writing step (step S5), the writing control unit 114 controls the writing unit 150 to perform writing processing on the substrate 101. Each blanker of the blanking aperture array plate 204 gives a desired exposure amount to each pixel by switching ON/OFF of a beam on the basis of the irradiation time control data.

Figure 4:
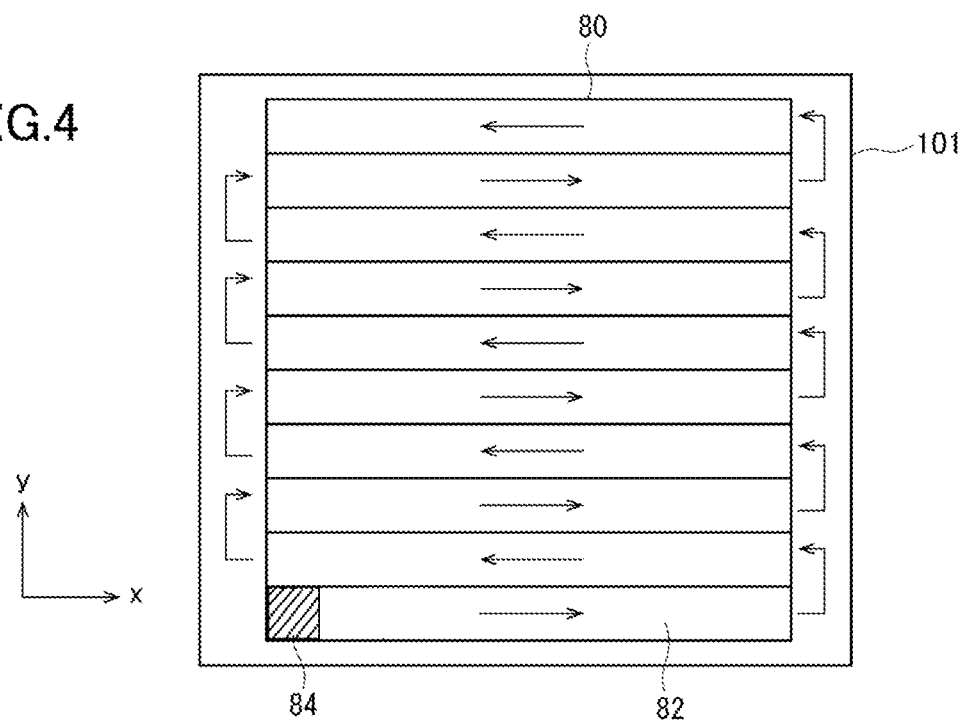
FIG. 4 is a view for explaining writing operation.

FIG. 4 is a conceptual diagram for explaining writing operation. As illustrated in FIG. 4, the writing region 80 of the substrate 101 is, for example, virtually divided into a plurality of stripe regions 82 having a strip shape of a predetermined width in a y direction (first direction). First, the XY stage 105 is moved so that an irradiation region (beam array) 84 that can be irradiated by one irradiation of multi-beams is located at a left end of the first stripe region 82, and then writing starts.

When the first stripe region 82 is written, writing is performed in a +x direction relatively by moving the XY stage 105 in a −x direction. The XY stage 105 is continuously moved at a predetermined speed. After end of the writing of the first stripe region 82, the stage position is moved in the −y direction so that the beam array 84 is located at a right end of the second stripe region 82. Next, writing is performed in the −x direction by moving the XY stage 105 in the +x direction.

In the third stripe region 82, writing is performed in the +x direction, and in the fourth stripe region 82, writing is performed in the −x direction. A writing time can be shortened by performing writing while alternately changing a direction. Alternatively, the stripe regions 82 may be always written in the same direction, that is, either the +x direction or the −x direction.

Figure 5:
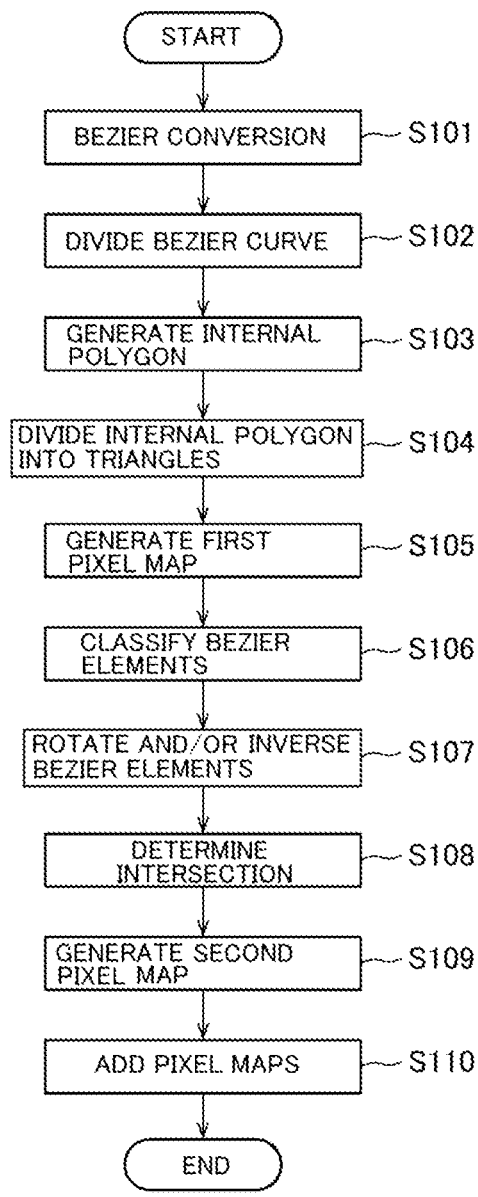
FIG. 5 is a flowchart for explaining a pixel map generation method.

Next, a method for generating a pixel map by the area density calculation unit 111 is described with reference to the flowchart illustrated in FIG. 5.

The area density calculation unit 111 reads out writing data from the storage unit 140 and converts a curve of a figure pattern (writing pattern) defined by a cubic B-spline curve into a cubic Bezier curve (step S101). For example, the cubic B-spline curve illustrated in FIG. 6a is converted into a cubic Bezier curve illustrated in FIG. 6b. FIG. 6c illustrates an example of a conversion formula.

A cubic Bezier curve is expressed by four control points, as illustrated in FIG. 7a. That is, in the example illustrated in FIG. 6b, consecutive combinations of four control points surround a figure. Among the four control points, two control points, specifically, a start point and an end point are located on a curve. A plurality of control points are defined and arranged in order in a predetermined direction (a clockwise direction or a counterclockwise direction) along a periphery of a figure.

The area density calculation unit 111 divides a Bezier curve expressed by four control points into smaller Bezier curves at positions of an extremum and an inflection point (step S102). The inflection point is a point at which curvature=(dPx/dt)(dPy2/dt2)−(dPy/dt)(dPx2/dt2)=0. The extremum is a point at which dPx/dt=0 and dPy/dt=0.

Hereinafter, Bezier curves divided at positions of an extremum and an inflection point are referred to as Bezier elements. For example, a Bezier curve illustrated in FIG. 7a includes a single maximal value, a single minimal value, and a single inflection point and is therefore divided into four Bezier elements B1 to B4 as illustrated in FIG. 7b.

As illustrated in FIG. 7c, each Bezier element is a curve element that monotonically increases or monotonically decreases in an X direction and a Y direction.

Figure 8A:
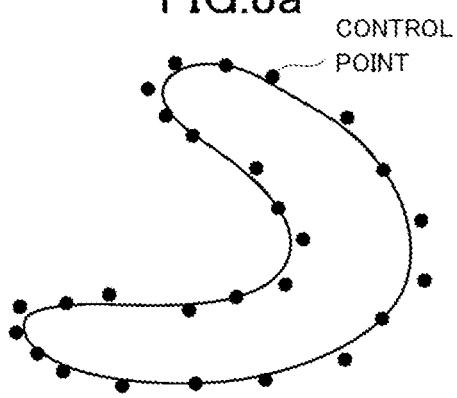
FIG. 8a illustrates an example of a Bezier curve.
Figure 8B:
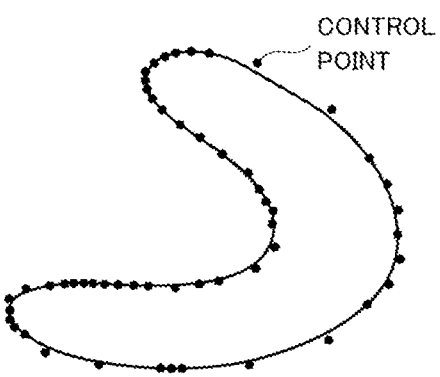
FIG. 8b illustrates an example of division of the Bezier curve.

FIG. 8a is identical to FIG. 6b and illustrates a Bezier curve before division at positions of an extremum and an inflection point. FIG. 8b illustrates a Bezier curve (Bezier elements) after division.

Figure 8C:
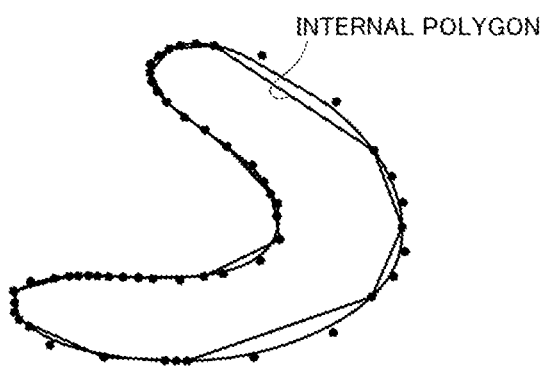
FIG. 8c illustrates an example of an internal polygon.

Next, a polygon (hereinafter referred to as an "internal polygon") is generated by extracting, for each of a plurality of Bezier elements, some of a plurality of control points and connecting the extracted control points by a straight line along an original definition order (a clockwise order or a counterclockwise order along a periphery of a figure) (step S103). In the present embodiment, the internal polygon is generated by extracting a start point and an end point of each of the Bezier elements. For example, the internal polygon such as the one illustrated in FIG. 8c is generated by connecting a start point and an end point of each of the Bezier elements illustrated in FIG. 8b in the definition order.

The generated internal polygon is divided into triangles by a known method (step S104). The generated internal polygon need not be divided into triangles and may be divided by using trapezoids.

A first pixel map is generated by calculating a coverage (area density) of each pixel by the internal polygon by using triangles obtained by dividing the internal polygon (step S105).

The Bezier elements are classified into eight types illustrated in FIG. 9a on the basis of an inclination of a segment connecting a start point and an end point and whether a control point other than the start point and the end point is located on the left or the right of a traveling direction of the segment (step S106).

Each of the Bezier elements is rotated and/or inversed so as to become a basic Bezier element illustrated in FIG. 9b (step S107).

Figure 11:
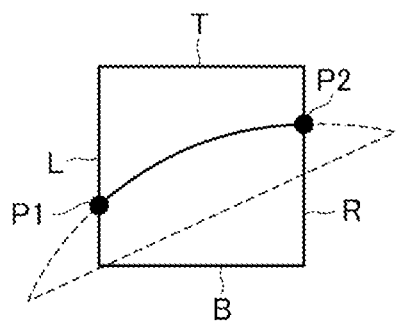
FIG. 11 illustrates an example of intersections.

It is determined, for each pixel, whether a boundary line of the pixel intersects a curve of the basic Bezier element (step S108). As illustrated in FIG. 10, an intersection is found by solving a third degree equation combining the Bezier curve and a straight line representing the pixel boundary. For example, intersections P1 and P2 illustrated in FIG. 11 are found. In a case where an intersection is present on a left side L or a bottom side B of the pixel, a remaining intersection is present on an upper side T or a right side R. In a case where no intersection is present on the left side L and the bottom side B, no intersection is present in this pixel. A maximum number of intersections per pixel is two. By taking this into consideration, intersection determination can be efficiently performed.

Figure 12:
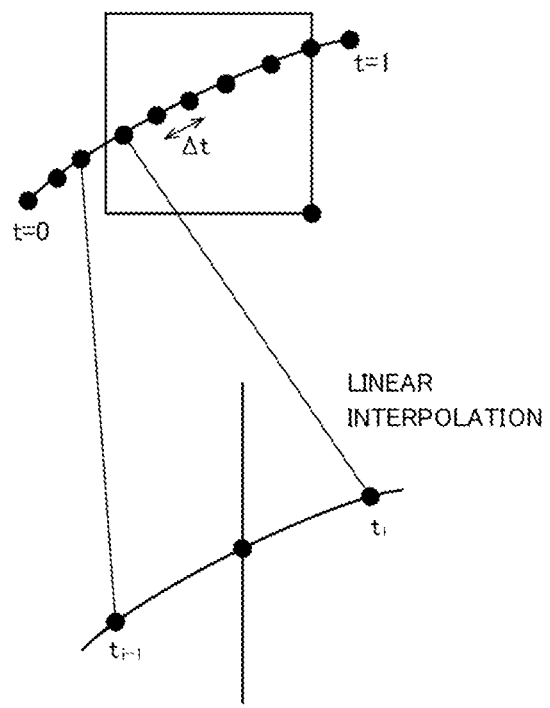
FIG. 12 is a view for explaining an intersection calculation method.

As illustrated in FIG. 12, the intersection determination may be performed by dividing a section from t=0 to t=1 on a curve by Δt, calculating coordinates at each position on the curve, and performing linear interpolation calculation on the basis of values of a point $t_i$ exceeding coordinate values of a pixel boundary for which an intersection is to be found by Δt or less and a previous point $t_{i-1}$. The interpolation calculation is performed for t on the basis of the coordinate values. The calculation of coordinates per Δt may be performed in parallel by using threads of a GPU or the like.

Figure 13:
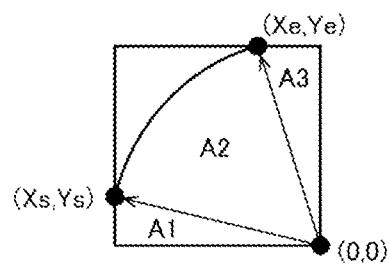
FIG. 13 illustrates an example of calculation of a pixel coverage.

In a case where a boundary line of a pixel and a curve of a Bezier element intersect, the pixel is divided into triangular parts (A1 and A3) and a fan-shaped part (A2), and an area of each part is calculated, as illustrated in FIG. 13. The area of the fan-shaped part is calculated as a line integral between intersections with the pixel.

A second pixel map is generated by adding the areas of the triangular parts and the fan-shaped part and calculating a coverage of the pixel (step S109). The calculated coverage is a coverage of a pixel in a peripheral part of a figure (writing pattern). Note that in a case where the Bezier element is located inside a line of the internal polygon, the calculated coverage is multiplied by −1.

The second pixel map that has been subjected to inverse operation for rotation and/or inversion in step S107 and the first pixel map generated in step S105 are added to generate a third pixel map (step S110). This third pixel map is used when the irradiation time calculation unit 112 calculates an amount of irradiation of a beam with which each pixel is irradiated.

As described above, according to the present embodiment, a Bezier curve is divided into small Bezier curves (Bezier elements) at an extremum and an inflection point. Accordingly, the maximum number of intersections of each pixel and the Bezier element is two. This makes it easy to calculate the intersections and a coverage, thereby making it possible to calculate a pixel coverage speedily and accurately.

In a case where the method according to the embodiment is not used, a Bezier curve (parametric curve) intersects one side of a segmented region (pixel) plural times or intersects three or more sides in some cases depending on an order of the curve. This makes it necessary to calculate a coverage while considering various ways of intersection, leading to an increase in processing amount. On the other hand, in a case where a parametric curve is divided at an extremum and an inflection point as in the above embodiment, curve elements obtained after the division have a shape that monotonously increases or decreases in one direction. Accordingly, in a case where the curve element intersects four sides (a right side, an upper side, a left side, and a lower side) of a boundary of a segmented region, the number of intersections is two, and the curve element intersects different sides. This simplifies a way of intersection of the curve element and the boundary of the segmented region. As a result, calculation of a coverage becomes easy, and a processing amount can be reduced. Furthermore, the number of elements to be processed is small and approximation is not performed, as compared with conventional coverage calculation using polygon approximation. It is therefore possible to calculate a coverage speedily and accurately.

A plurality of Bezier elements generated by division of a Bezier curve can be used as units of parallel processing. For example, the Bezier elements can be effectively used in parallel computation using a GPU, and high-speed processing can be realized.

Although an example of conversion into a cubic Bezier curve has been described in the above embodiment, an order of the curve is not limited to 3.

Although an example in which an input figure is expressed by a B-spline has been described in the above embodiment, a figure expressed by any of other parametric curves may be input data, as long as the figure can be converted into a Bezier curve.

The above processing may be performed by using a parametric curve other than a Bezier curve. The parametric curve is divided at positions of an extremum and an inflection point to generate a plurality of parametric elements. An internal polygon is generated by connecting at least one of a plurality of control points included in each of the parametric elements in order with a line. Intersections of each of the plurality of parametric elements and a pixel boundary are found to calculate a pixel coverage in a peripheral part of a figure. A coverage of each pixel is calculated from this pixel coverage and a pixel coverage by an internal polygon.

Although a writing device that writes a pattern on a substrate has been described in the above embodiment, the present invention is also applicable to other irradiation devices such as an inspection device that irradiate a target object with a beam. Although a multi-beam irradiation device that radiate a lot of beams at one time by using multi-beams has been described in the above embodiment, a similar method is also applicable to a single-beam irradiation device that irradiates a target substrate with a single beam.

At least part of the control calculator 110 described in the above embodiments may be implemented in either hardware or software. When implemented in software, a program that realizes at least part of functions of the control calculator 110 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the control calculator 110 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam irradiation method, comprising:
    generating a plurality of parametric elements by dividing, at positions of an extremum and an inflection point, a parametric curve that expresses a shape of a writing pattern and is defined by a plurality of control points arranged in order in a predetermined direction;
    generating a polygon by extracting, for each of the parametric elements, one or some of the plurality of control points and connecting the extracted control points in order in the predetermined direction;
    calculating a coverage by the polygon in each of a plurality of rectangular segmented regions obtained by dividing a target to be irradiated with a charged particle beam into a predetermined size;
    calculating a coverage of each segmented region in a peripheral part of the writing pattern by finding intersections of each of the plurality of parametric elements and four sides of each of the plurality of segmented regions;
    calculating an irradiation amount of each segmented region based on the calculated coverage; and
    controlling a charged particle beam irradiation apparatus to irradiate the target with the charged particle beam at the calculated irradiation amount to write a pattern onto the target.

2. The method according to claim 1, wherein the parametric curve is a Bezier curve.

3. The method according to claim 2, wherein
    a plurality of Bezier elements are generated by dividing the Bezier curve at positions of an extremum and an inflection point; and
    the polygon is generated by extracting a start point and an end point from among a plurality of control points included in each of the plurality of Bezier elements and connecting the extracted start point and end point by a straight line in order in the predetermined direction.

4. The method according to claim 1, wherein
    the coverage of the segmented region is calculated by dividing the segmented region into a triangular part and a fan-shaped part by using intersections of the parametric element and the four sides of the segmented region and adding an area of the triangular part and an area of the fan-shaped part.

5. A non-transitory computer-readable recording medium storing a program causing a computer to execute a process comprising:
   generating a plurality of parametric elements by dividing, at positions of an extremum and an inflection point, a parametric curve that expresses a shape of a writing pattern and is defined by a plurality of control points arranged in order in a predetermined direction;
   generating a polygon by extracting, for each of the parametric elements, one or some of the plurality of control points and connecting the extracted control points in order in the predetermined direction;
   calculating a coverage by the polygon in each of a plurality of rectangular segmented regions obtained by dividing a target to be irradiated with a charged particle beam into a predetermined size;
   calculating a coverage of each segmented region in a peripheral part of the writing pattern by finding intersections of each of the plurality of parametric elements and four sides of each of the plurality of segmented regions;
   calculating an irradiation amount of each segmented region based on the calculated coverage; and
   controlling a charged particle beam irradiation apparatus to irradiate the target with the charged particle beam at the calculated irradiation amount to write a pattern onto the target.

6. The computer-readable recording medium according to claim 5, wherein the parametric curve is a Bezier curve.

7. The computer-readable recording medium according to claim 6, wherein the program causes the computer to:
   generate a plurality of Bezier elements by dividing the Bezier curve at positions of an extremum and an inflection point; and
   generate the polygon by extracting a start point and an end point from among a plurality of control points included in each of the plurality of Bezier elements and connecting the extracted start point and end point by a straight line in order in the predetermined direction.

8. The computer-readable recording medium according to claim 5, wherein the program causes the computer to calculate the coverage of the segmented region by dividing the segmented region into a triangular part and a fan-shaped part by using intersections of the parametric element and the four sides of the segmented region and adding an area of the triangular part and an area of the fan-shaped part.

9. A charged particle beam irradiation devices, comprising:
   an irradiation device configured to irradiate a target with a charged particle beam; and
   control circuitry configured to generate a plurality of parametric elements by dividing, at positions of an extremum and an inflection point, a parametric curve that expresses a shape of a writing pattern and is defined by a plurality of control points arranged in order in a predetermined direction, generate a polygon by extracting, for each of the parametric elements, one or some of the plurality of control points and connecting the extracted control points in order in the predetermined direction, calculate a coverage by the polygon in each of a plurality of rectangular segmented regions obtained by dividing a target to be irradiated with a charged particle beam into a predetermined size, calculate a coverage of each segmented region in a peripheral part of the writing pattern by finding intersections of each of the plurality of parametric elements and four sides of each of the plurality of segmented regions, calculate an irradiation amount of each segmented region based on the coverage, and control the irradiation device to irradiate the target with the charged particle beam at the calculated irradiation amount to write a pattern onto the target.

10. The charged particle beam irradiation device according to claim 9, wherein the parametric curve divided by the control circuitry is a Bezier curve.

11. The charged particle beam irradiation device according to claim 10, wherein the control circuitry is further configured to generate a plurality of Bezier elements by dividing the Bezier curve at positions of an extremum and an inflection point, and generate the polygon by extracting a start point and an end point from among a plurality of control points included in each of the plurality of Bezier elements and connecting the extracted start point and end point by a straight line in order in the predetermined direction.

12. The charged particle beam irradiation device according to claim 9, wherein the control circuitry is further configured to calculate the coverage of the segmented region by dividing the segmented region into a triangular part and a fan-shaped part by using intersections of the parametric element and the four sides of the segmented region and adding an area of the triangular part and an area of the fan-shaped part.

* * * * *